(12) United States Patent
Nakashima

(10) Patent No.: US 8,053,934 B2
(45) Date of Patent: Nov. 8, 2011

(54) SEMICONDUCTOR INTEGRATED CIRCUIT DEVICE HAVING CONTROL CIRCUIT TO SELECTIVELY ACTIVATE DECOUPLING CELLS

(75) Inventor: Hidenari Nakashima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 456 days.

(21) Appl. No.: 12/285,086

(22) Filed: Sep. 29, 2008

(65) Prior Publication Data

US 2009/0096516 A1 Apr. 16, 2009

(30) Foreign Application Priority Data

Oct. 16, 2007 (JP) .................................. 2007-268883

(51) Int. Cl.
*H02B 1/24* (2006.01)

(52) U.S. Cl. ........................................................ 307/115
(58) Field of Classification Search .................. 307/109, 307/115
See application file for complete search history.

(56) References Cited

U.S. PATENT DOCUMENTS

| | | | |
|---|---|---|---|
| 6,535,075 B2 * | 3/2003 | Frech et al. .................. | 333/17.1 |
| 6,949,967 B2 * | 9/2005 | Wang et al. .................. | 327/337 |
| 7,199,490 B2 | 4/2007 | Nomura | |
| 7,227,211 B2 | 6/2007 | Tsutsumi et al. | |
| 7,701,277 B2 * | 4/2010 | Toffolon et al. ............. | 327/310 |
| 2005/0122755 A1 | 6/2005 | Tsutsumi et al. | |

FOREIGN PATENT DOCUMENTS

| | | |
|---|---|---|
| JP | 2001-358294 | 12/2001 |
| JP | 2005-175003 | 6/2005 |
| JP | 2005-268694 | 9/2005 |

OTHER PUBLICATIONS

Kobayashi, et al., "Measurement Results of On-chip IR-drop" Custom Integrated Circuit Conference, 2002, Proceedings of the IEEE 2002, Volume, Issue, 2002 pp. 521-524.

* cited by examiner

*Primary Examiner* — Rexford Barnie
*Assistant Examiner* — Hal Kaplan
(74) *Attorney, Agent, or Firm* — McGinn Intellectual Property Law Group, PLLC

(57) ABSTRACT

The semiconductor integrated circuit device includes a plurality of decoupling cells that suppress power noise respectively, a plurality of power switches that connect the decoupling cells to a power line respectively, and a control circuit that controls the number of power switches selected from among the plurality of power switches and to be turned on according to power noise to be changed according to the operation state of each of internal circuits driven by a power supplied from the power line.

11 Claims, 13 Drawing Sheets

R: POWER SWITCH = ON → 0.1 Ω
R: POWER SWITCH = OFF → 100 Ω

| | OPERATION MODE 1 | OPERATION MODE 2 | |
|---|---|---|---|
| | RESONANCE FREQUENCY 1 | RESONANCE FREQUENCY 2 | RESONANCE FREQUENCY 2a |
| LOGIC CIRCUIT 12a | ON | OFF | OFF |
| LOGIC CIRCUIT 12b | ON | ON | ON |
| LOGIC CIRCUIT 13c | ON | ON | ON |
| DECOUPLING CELL 14a | OFF | OFF | ON |
| DECOUPLING CELL 14b | OFF | OFF | OFF |

SEMICONDUCTOR INTEGRATED CIRCUIT DEVICE HAVING CONTROL CIRCUIT TO SELECTIVELY ACTIVATE DECOUPLING CELLS

BACKGROUND OF THE INVENTION

1. Field of the Invention

The present invention relates to a semiconductor integrated circuit device, particularly to a semiconductor integrated circuit device that includes a decoupling cell that suppresses power noise.

2. Description of Related Art

In recent years, the supply voltage of semiconductor integrated circuit devices has become lower and the power noise has affected more significantly operations of the circuits of those devices. This is why such semiconductor integrated circuit devices have come to include a decoupling capacitor provided between a power line and a ground line to stabilize the supply voltage respectively. The patent document 1 (hereunder, to be referred to as the conventional example 1) discloses an example of such a decoupling capacitor that can be built in such semiconductor integrated circuit devices.

A semiconductor integrated circuit device, when including a plurality of circuit blocks therein, changes the operation mode of each of the circuit blocks in accordance with how the circuit block is used, thereby suppressing its power consumption. For example, the semiconductor integrated circuit device operates each idle circuit block in the standby mode that requires small power consumption and operates each active circuit block in the normal operation mode that requires large power consumption.

The patent documents 2 and 3 (hereunder, to be referred to as the related examples 2 and 3) disclose examples of semiconductor integrated circuit devices, each of which includes a function for switching between such operation modes. FIG. 14 shows a block diagram of the semiconductor integrated circuit device 100 disclosed in the related example 2. As shown in FIG. 14, in the semiconductor integrated circuit device 100, a logic circuit 101 and a power gate switch 102 are connected to each other serially between a power line VDD and a ground line VSS. In the semiconductor integrated circuit device 100, a reference potential line VVss is also connected between the logic circuit 101 and the power gate switch 102. In the conventional example 2, the logic circuit 101 turns on/off the power gate switch 102 according to its operation mode. Consequently, the semiconductor integrated circuit device 100 comes to suppress the leak current in the standby mode, thereby it is assured of fast operations that require large power consumption in the normal operation mode.

In the related example 3, the decoupling capacitor charges the parasitic capacity of the first circuit block when the first circuit block operation mode is changed from standby to normal. Consequently, the semiconductor integrated circuit device 100 suppresses the amount of charge into the parasitic capacity of the first circuit block from the power supply at the time of each operation mode change, thereby suppressing the power noise at that time.

[Patent document 1] Japanese Unexamined Patent Application Publication No. 2005-175003
[Patent document 2] Japanese Unexamined Patent Application Publication No. 2005-268694
[Patent document 3] Japanese Unexamined Patent Application Publication No. 2001-358294
[Non-patent document 1] "Measurement Results of On-chip IR-drop", K. Kobayashi et al. CUSTOM INTEGRATED CIRCUIT CONFERENCE, 2002, Proceedings of the IEEE 2002, volume, issue, 2002 pp. 521-524

SUMMARY OF THE INVENTION

However, the powering route of the semiconductor integrated circuit device includes a resonance frequency in accordance with the parasitic component of the route. This resonance frequency is determined by the parasitic resistance and parasitic capacity of the power line, the capacity of the decoupling capacitor, and the package parasitic components (e.g., inductance component L, capacity component C, and resistance component R). The resonance frequency varies according to the operation state of the subject circuit block built in the semiconductor integrated circuit device. On the other hand, the logic circuits built in the semiconductor integrated circuit device operate in accordance with a clock signal input from external. If the frequency of this clock signal matches with the resonance frequency of the powering route, the power noise increases. This has been a problem. In any of the conventional examples 1 to 3, the relationship between the frequency of the clock signal and the resonance frequency cannot be changed, so the power noise increases when such frequency matching occurs between the clock signal frequency and the resonance frequency.

An exemplary aspect of the present invention is a semiconductor integrated circuit device comprising a plurality of decoupling cells that suppress power noise respectively; a plurality of power switches that connect the plurality of decoupling cells to a power line respectively; and a control circuit that controls the number of power switches selected from among the plurality of power switches and to be turned ON according to the level of the power noise to be varied according to the operation state of an internal circuit driven by a power supplied from the power line.

As described above, the semiconductor integrated circuit device of the present invention controls the ON/OFF state of each power switch according to the level of the power noise to be varied according to the operation state of the internal circuit. Consequently, the semiconductor integrated circuit device of the present invention can change the resonance frequency of the power line according to the operation state of the internal circuit. This means that the semiconductor integrated circuit device can prevent the frequency matching that might otherwise occur between the power line resonance frequency and the clock signal frequency due to the change of the operation state of the internal circuit.

According to the semiconductor integrated circuit device of the present invention, therefore, it is possible to prevent the power noise from increasing to be caused by the power line resonance frequency regardless of the operation state of the internal circuit.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
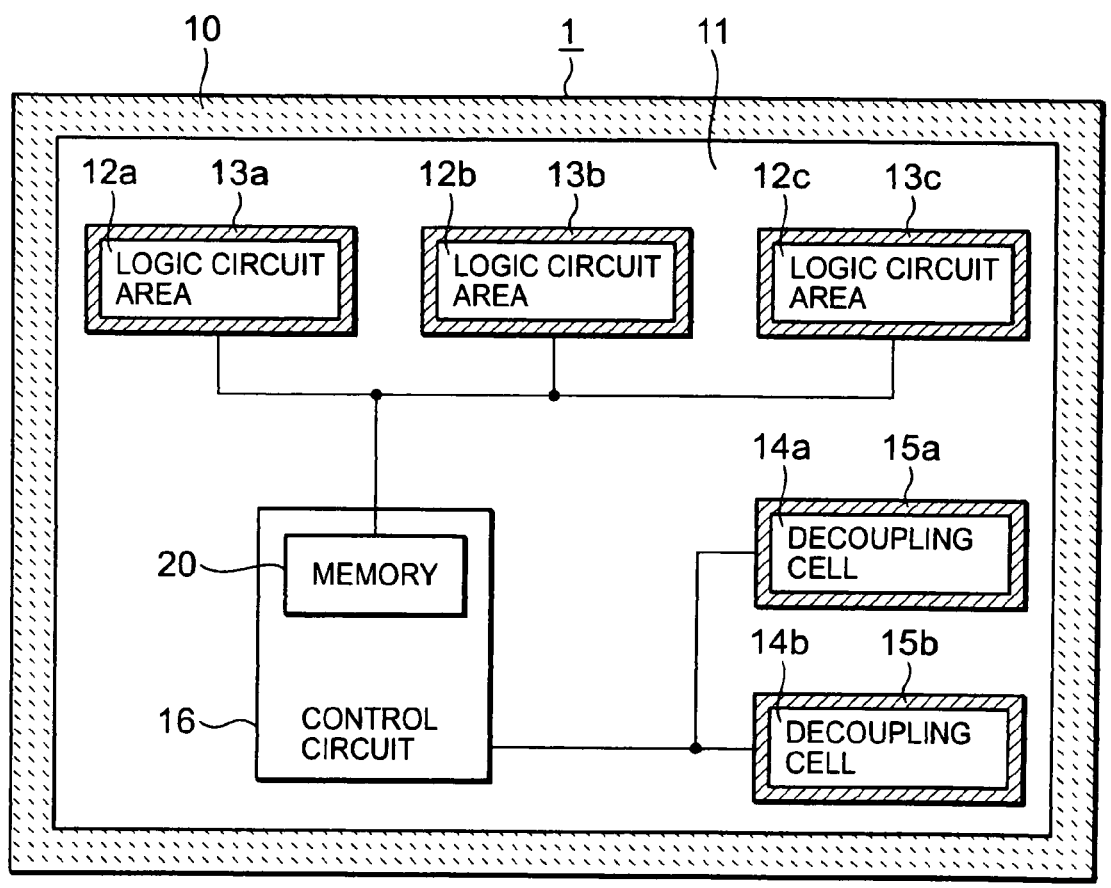
FIG. 1 is a block diagram of a semiconductor integrated circuit device in a first exemplary embodiment.

FIG. 1 shows a block diagram of a semiconductor integrated circuit device 1 in a first exemplary embodiment. The semiconductor integrated circuit device 1 includes an input/output circuit area 10 at the outer periphery of a chip and an internal circuit area 11 inside the area 10. The internal circuit area 11 includes logic circuits 12a to 12c, decoupling cells 14a and 14b, and a control circuit 16 that are combined to form the internal circuit therein.

Each of the logic circuits 12a to 12c has its corresponding power switch 13a/13b/13c disposed around itself. Each power switch supplies a power to its corresponding logic circuit formed in the area. Each logic circuit is driven by a supplied power and according to a clock signal inputted from external. The power switches 13a to 13c, when turned on respectively, supply a power to their corresponding logic circuits. When the power switches 13a to 13c are turned OFF, they stop the power supply to the logic circuits. A power control circuit (not shown) controls those power switches 13a to 13c.

The decoupling cells 14a and 14b (hereunder, to be referred to as the decoupling cells 14 as needed) are capacity elements formed between the power line and the ground line. Each of the decoupling cells 14a and 14b includes a power switch 15a/15b (hereunder, to be referred to as the power switches 15 as needed) at its periphery. The control circuit 16 turns ON/OFF each of those power switches 15a and 15b. When the power switch 15a/15b is ON, the resistance value is low, thereby the power line is connected to the corresponding decoupling cell. When the power switch 15a/15b is OFF, the resistance value is high, thereby the power line is disconnected from the corresponding decoupling cell practically.

The control circuit 16 turns ON the power switch 15a/15b according to the clock frequency information that includes the package information and the clock signal frequency information. The package information includes the operation state of each of the logic circuits 12a to 12c and the package parasitic component information. A signal output from the control circuit 16 and used to control the power switches 15 is referred to as a switch control signal SC in this first embodiment. The package information includes an inductance component L, a capacity component C, and a resistance component R that are assumed as the parasitic components of the package. In this first embodiment, the control circuit 16 includes a memory 20.

Figure 2:
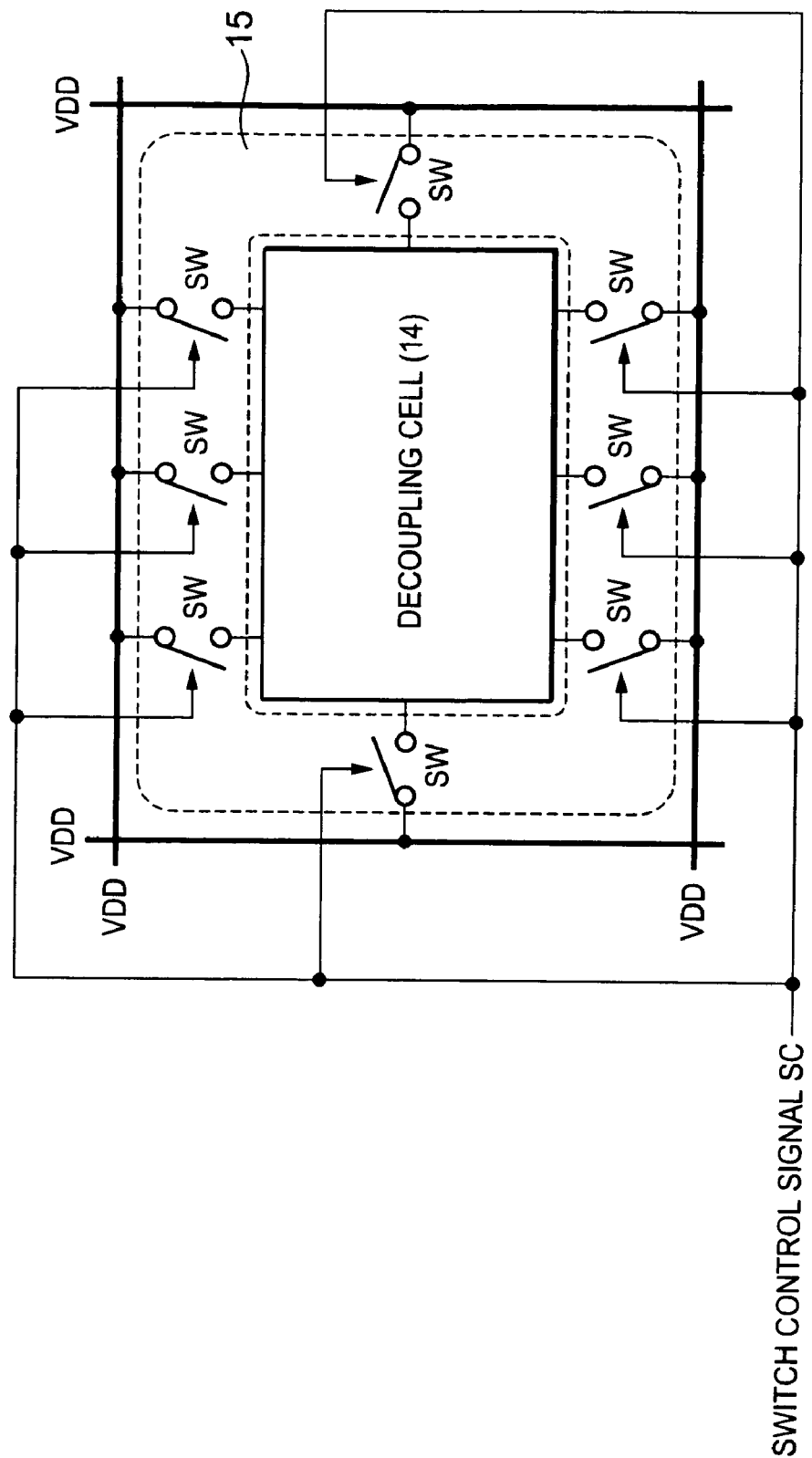
FIG. 2 is a schematic diagram of a decoupling cell in the first exemplary embodiment.

FIG. 2 shows a schematic diagram of a decoupling cell 14 and a power switch 15. The power switch 15 includes a plurality of switch circuits SW. Those switch circuits SW are disposed around the decoupling cell 14. Those switch circuits SW are provided between the power line VDD and the decoupling cell 14 respectively. The switch circuits SW are controlled by the switch control signal SC respectively.

Figure 3:
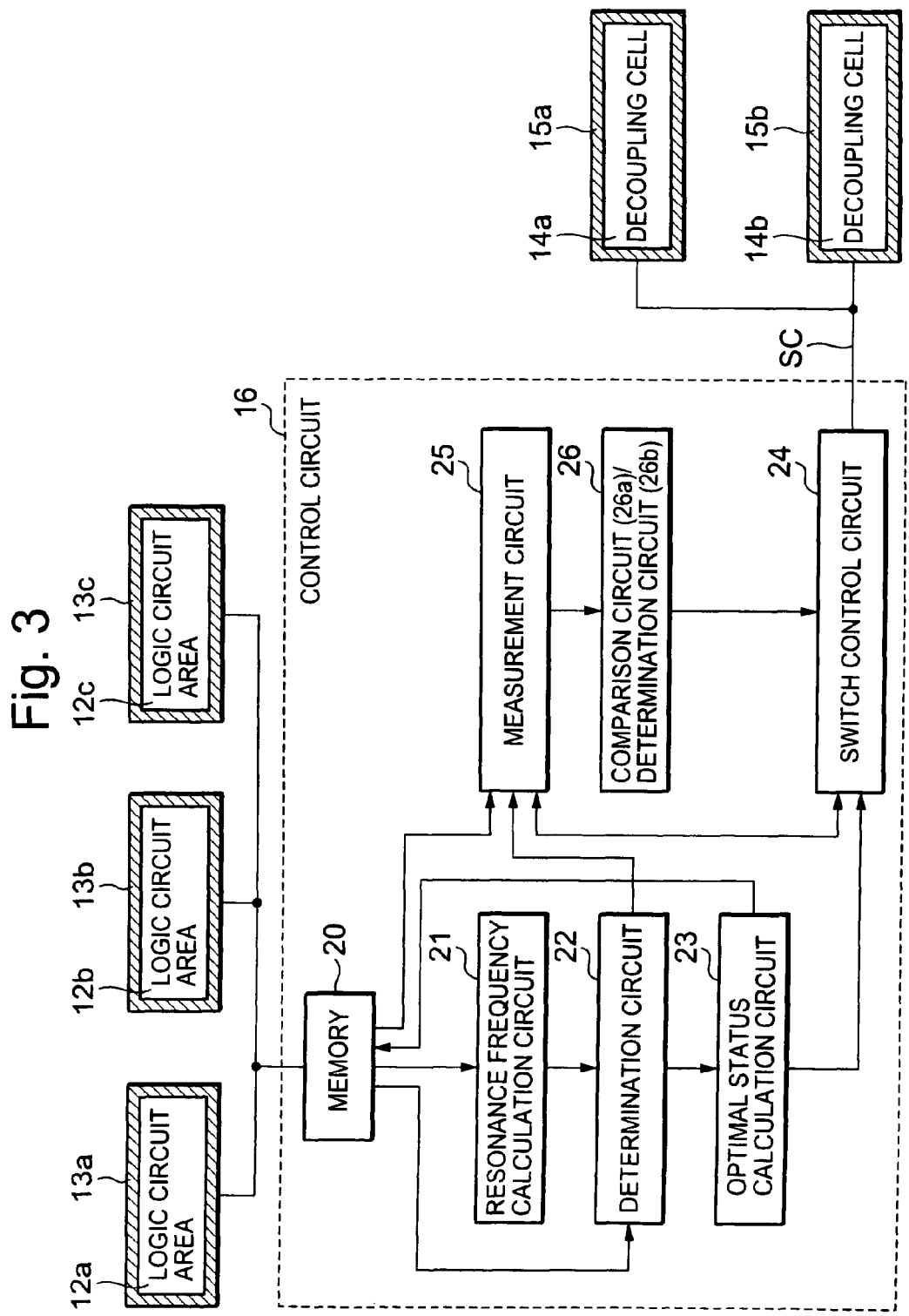
FIG. 3 is a block diagram of a control circuit in the first exemplary embodiment.

FIG. 3 shows a block diagram of the control circuit 16. As shown in FIG. 3, the control circuit 16 includes a memory 20, a resonance frequency calculation circuit 21, a decision circuit 22, an optimal state calculation circuit 23, a measurement circuit 25, a comparison/decision circuit 26, and a switch control circuit 24. The memory circuit 20 stores the package information and the clock signal frequency information beforehand. The resonance frequency calculation circuit 21 calculates the resonance frequency of the power line according to the package information and the operation state of each logic circuit. The resonance frequency of the power line calculated by the resonance frequency calculation circuit 21 at this time means a resonance frequency assumed when all the power switches 15 are turned OFF (hereunder, to be referred to as the OFF state). The decision circuit 22 decides whether or not the clock signal frequency matches with the resonance frequency calculated by the resonance frequency calculation circuit 21.

The optimal state calculation circuit 23 calculates the number of power switches to be turned ON according to the decision result of the decision circuit 22. Concretely, the optimal state calculation circuit 23 calculates how many power switches should be turned ON to prevent the frequency matching between the clock signal frequency and the power line resonance frequency. The switch control circuit 24 outputs the switch control signal SC according to the calculation result of the optimal state calculation circuit 23 or the measurement result of the measurement circuit 25.

The measurement circuit 25 measures the level of the power noise of the power line. This measurement circuit 25 may measure any of AC power noise and DC power noise. As a circuit for measuring DC power noise, there is a circuit disclosed in "Measurement Results of On-chip IR-drop", K. Kobayashi et al., CUSTOM INTEGRATED CIRCUITS CONFERENCE, 2002, Proceedings of the IEEE 2002, volume, issue, 2002 pp. 521-524 (hereunder, to be referred to as the non-patent document 1). The measurement circuit disclosed in the non-patent document 1 includes a level shifter and a flip-flop circuit. In the measurement circuit, the level shifter detects the supply voltage that goes down to the reference voltage or under, then the flip-flop circuit measures the time during which the supply voltage is kept under the reference voltage. This means that the measurement circuit disclosed in the non-patent document 1 measures the level of object power noise by measuring the supply voltage fallen under the reference voltage.

The comparison/decision circuit 26 includes a comparison circuit 26a and a decision circuit 26b. The comparison circuit 26a outputs a result of comparison made for whether the power noise has increased or decreased before and after the subject power switch is turned ON/OFF according to the measurement result of the measurement circuit 25. The decision circuit 26b decides whether or not the power noise measured by the measurement circuit 25 exceeds the preset reference value.

Figure 4:
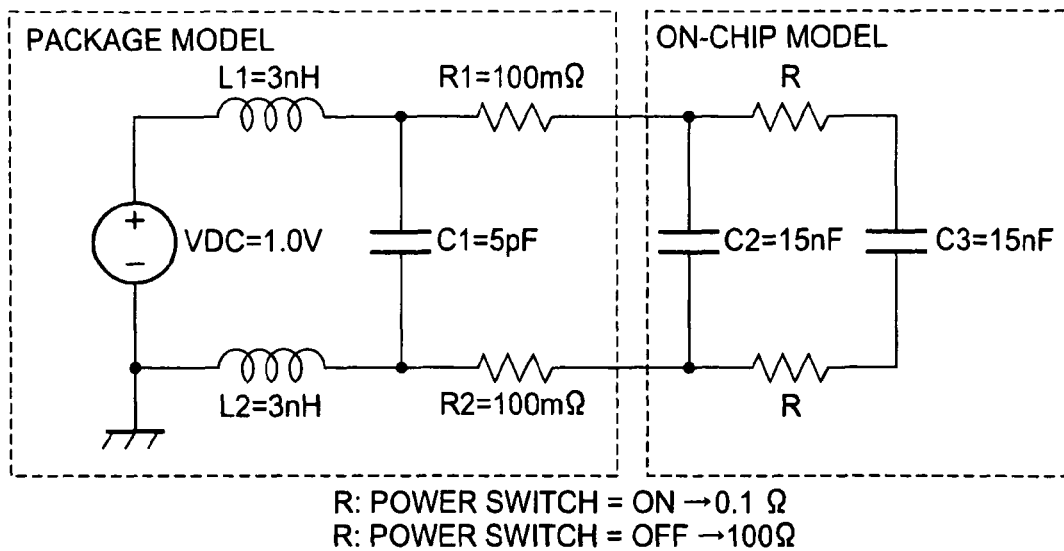
FIG. 4 is an equivalent circuit that calculates a resonance frequency in the semiconductor integrated circuit device in the first exemplary embodiment.

Next, there will be described the resonance frequency in the semiconductor integrated circuit device 1. FIG. 4 shows an example of an equivalent circuit used for calculating the resonance frequency. In the example shown in FIG. 4, a package model is connected to an on-chip model. The package model is an equivalent circuit used for denoting the package parasitic components of the semiconductor integrated circuit device 1. The on-chip model is an equivalent circuit that denotes a parasitic component of a circuit formed in the semiconductor integrated circuit device 1.

The package model includes a power supply VDC, coils L1 and L2, a capacity C1, and resistors R1 and R2. The power supply VDC has a − terminal connected to the ground line and a + terminal connected to the power line. The coil L1 and the resistor R1 are connected serially to the power line. The power line transmits a supply voltage to the on-chip model through the coil L1 and the resistor R1. The coil L2 and the resistor R2 are connected serially to the ground line. The ground line transmits the ground voltage to the on-chip model through the coil L2 and the resistor R2. The capacity C1 is connected between the ground line and the power line.

The on-chip model includes a resistor R and capacities C2 and C3. In the on-chip model, a resistor R is inserted in each of the power line and the ground line. The resistor R is a resistance component caused by a power switch. The capacities C2 and C3 are connected between the power line and the ground line respectively. The capacity C2 is a capacity component in a circuit formed in the semiconductor integrated circuit device 1. The capacity C3 is a capacity component of a decoupling cell.

Figure 5:
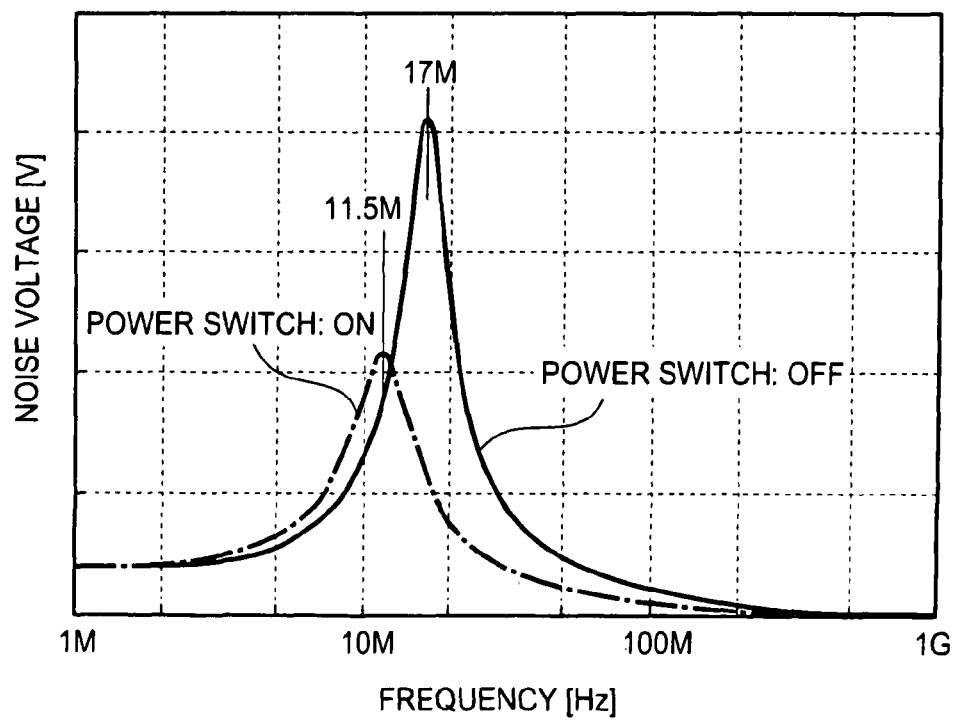
FIG. 5 is a graph denoting how the resonance frequency changes in the first exemplary embodiment.

In this first exemplary embodiment, when the power switch is ON, the resistance value is assumed as 0.1Ω and when the power switch is OFF, it is assumed that the resistance value is 100Ω, the inductance of the coils L1 and L2 is 3 nH, the capacity C1 value is 5 pF, the resistance values of the resistors R1 and R2 are 100 mΩ, and the capacity values of the capacities C2 and C3 are 15 nF to calculate the resonance frequency. FIG. 5 shows the measurement result of the resonance frequency in the equivalent circuit shown in FIG. 6. As shown in FIG. 5, when the power switch is OFF, the power line resonance frequency is about 17 MHz. On the other hand, when the power switch is turned ON, the resonance frequency is changed to about 11.5 MHz.

Figure 6:
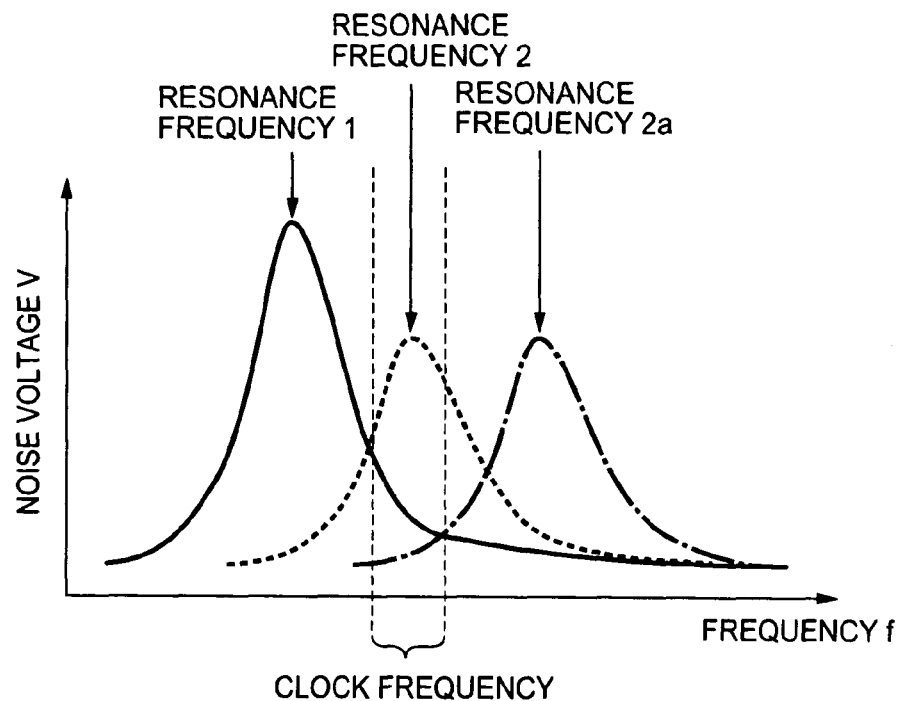
FIG. 6 is a graph denoting how the resonance frequency changes in accordance with the operation mode in the first exemplary embodiment.

Here, because each of the logic circuits 12a to 12c includes a parasitic capacity, if the power switches 13a to 13c are controlled to change the operation states of the logic circuits 12a to 12c respectively, then the power line resonance frequency changes. And if the changed resonance frequency comes to match with the clock signal frequency, then the power noise increases. This is why the power switches 15 connected to the decoupling cell 14 are controlled to shift the power line resonance frequency from the clock signal frequency in this first embodiment. FIG. 6 shows an example of how the resonance frequency changes when the power switches 15 are controlled such way.

As shown in FIG. 6, in the operation mode 1 in which the logic circuits 12a to 12c are active, the resonance frequency differs from the clock signal frequency even when both the decoupling cells 14a and 14b are disconnected by the power switches 15a and 15b respectively. On the other hand, in the operation mode 2 in which the logic circuit 12a is idle and the logic circuits 12b and 12c are active, and the decoupling cells 14a and 14b are disconnected (from the power line) by the power switches 15a and 15b, the resonance frequency matches with the clock signal frequency. In this first embodiment, therefore, the power switch 15a connected to the decoupling cell 14a is turned ON in the operation state 2 to shift the resonance frequency, thereby assuming the resonance frequency 2a.

Figure 7:
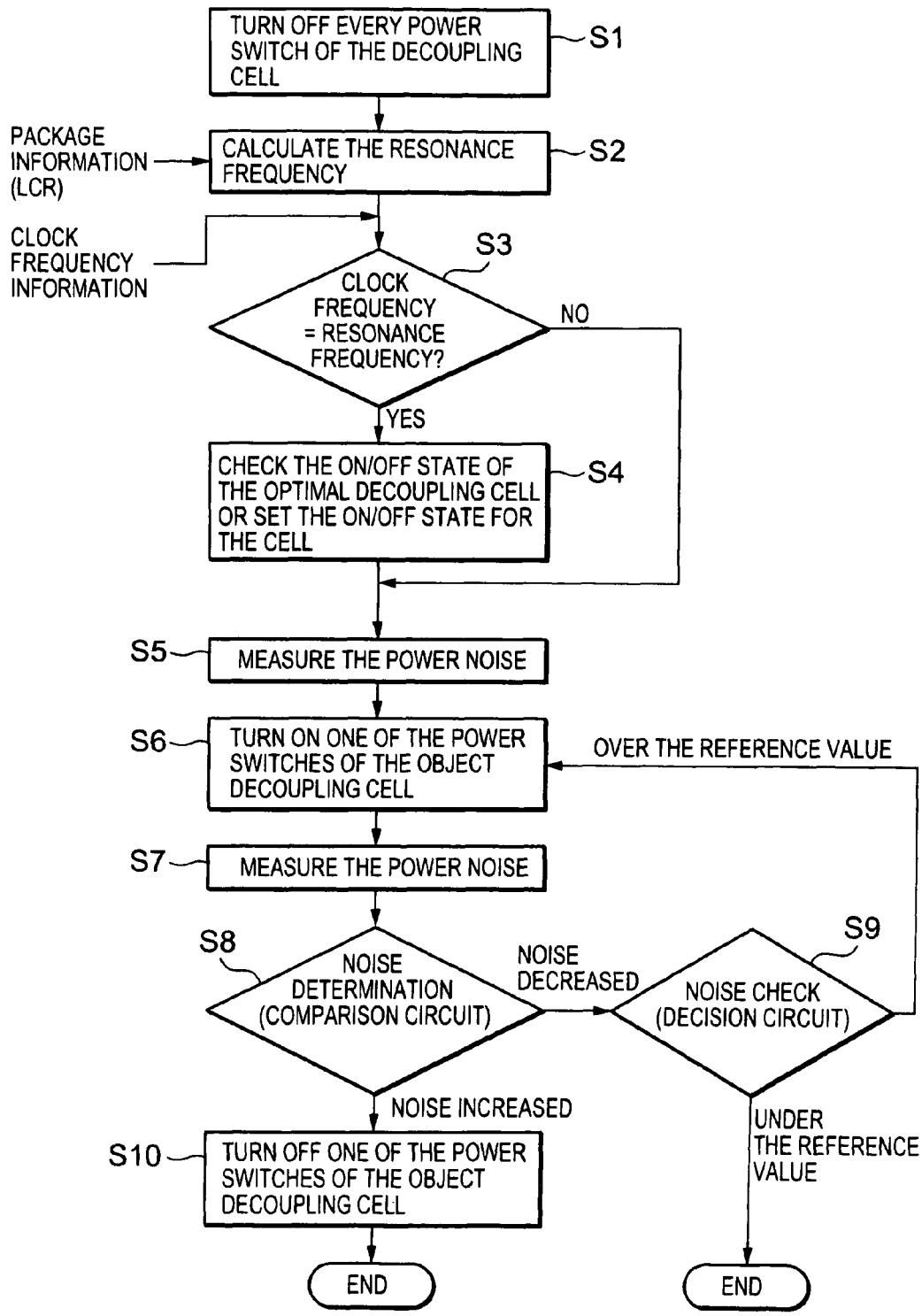
FIG. 7 is a flowchart of the operation of the semiconductor integrated circuit device in the first exemplary embodiment.

Next, there will be described the operation of the semiconductor integrated circuit device 1 with reference to a flowchart shown in FIG. 7. The flowchart denotes the operation of the semiconductor integrated circuit device 1 in this first embodiment. As shown in FIG. 7, in this first embodiment, at first all the power switches of an object decoupling cell are turned OFF (step S1). Then, the resonance frequency calculation circuit 21 calculates the resonance frequency according to the package information and the operation states of the logic circuits (step S2). The package information and the operation states of the logic circuits are all stored in the memory 20. After that, the decision circuit 22 decides whether or not the clock signal frequency matches with the resonance frequency calculated by the resonance frequency calculation circuit 21 (step S3).

If the decision result is YES in step S3, then the optimal state calculation circuit 23 searches the optimal states of the power switches 15a and 15b so that the resonance frequency is shifted from the clock signal frequency and the switch control circuit 24 controls the power switches 15a and 15b according to the search result (step S4). On the other hand, if the decision result is NO in step S3, then control goes to step S5.

In step S5, the measurement circuit 25 measures power noise. When the measurement circuit 25 completes the power noise measurement, the switch control circuit 24 turns ON one OFF state power switch (step S6). The measurement circuit 25 then measures the power noise again (step S7).

After that, the comparison circuit 26a compares the power noise level measured in step S5 with the power noise level measured in step S7 (step S8). If the result of the comparison in step S8 denotes that the power noise level after the switching-over in step S6 is lower, the decision circuit 26b then compares the power noise level measured in step S7 with the preset reference value (step S9).

If the power noise level measured in step S7 is under the preset reference value, then the control circuit exits the power switch controlling. On the other hand, if the power noise level measured in step S7 is over the reference value, then control returns to step S6 in which the control circuit turns ON all the OFF state power switches. If the power noise level after the switching-over in step S6 is found to be higher in step S8, then the control circuit turns OFF the power switches, then exits the switch controlling (step S10).

As described above, the semiconductor integrated circuit device 1 in this embodiment switches the power switches 15 between ON and OFF according to the operation state of each object logic circuit and the clock signal frequency. Consequently, when the power line resonance frequency changes according to the operation state of the object logic circuit, the decoupling cell 14 can shift the resonance frequency from the clock signal frequency. As a result, the semiconductor integrated circuit device 1 can suppress the increase of the power noise level to stabilize the circuit operation.

Furthermore, in the semiconductor integrated circuit device 1 in the initial state, all the power switches 15 connected to an object decoupling cell are turned OFF. Then, only the minimum number of power switches 15 is turned ON according to the power noise level. Consequently, the leak current flowing through the decoupling cell 14 can be suppressed up to the minimum level. In order to reduce the leak current, the controlling shown in FIG. 7 should preferably be carried out each time the operation mode is changed in the semiconductor integrated circuit device 1.

This means that the semiconductor integrated circuit device 1 in this embodiment can reduce the power noise caused by the relationship between the power line resonance frequency and the clock signal frequency and prevent the increase of the leak current flowing in the decoupling cell.

Second Exemplary Embodiment

Figure 8:
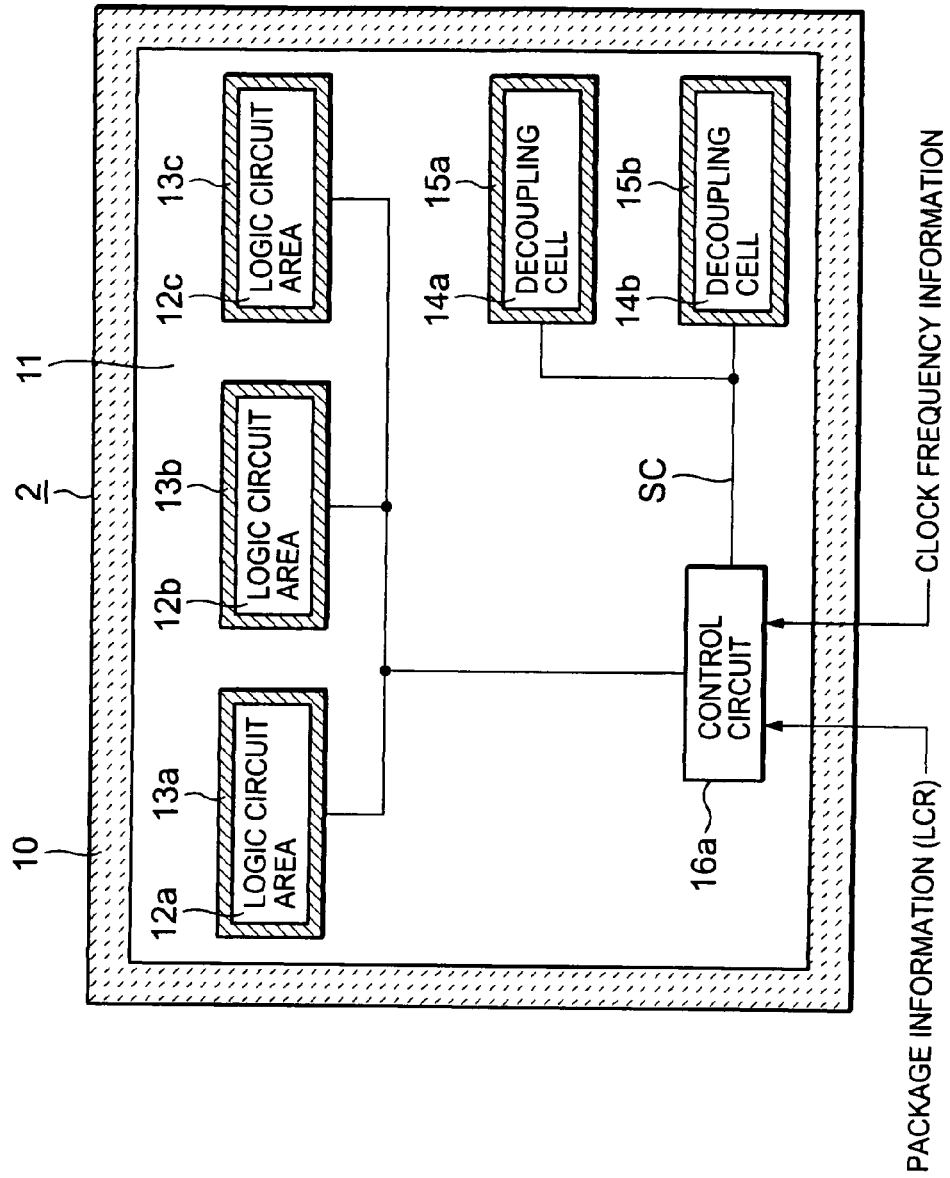
FIG. 8 is a block diagram of a semiconductor integrated circuit device in a second exemplary embodiment.
Figure 9:
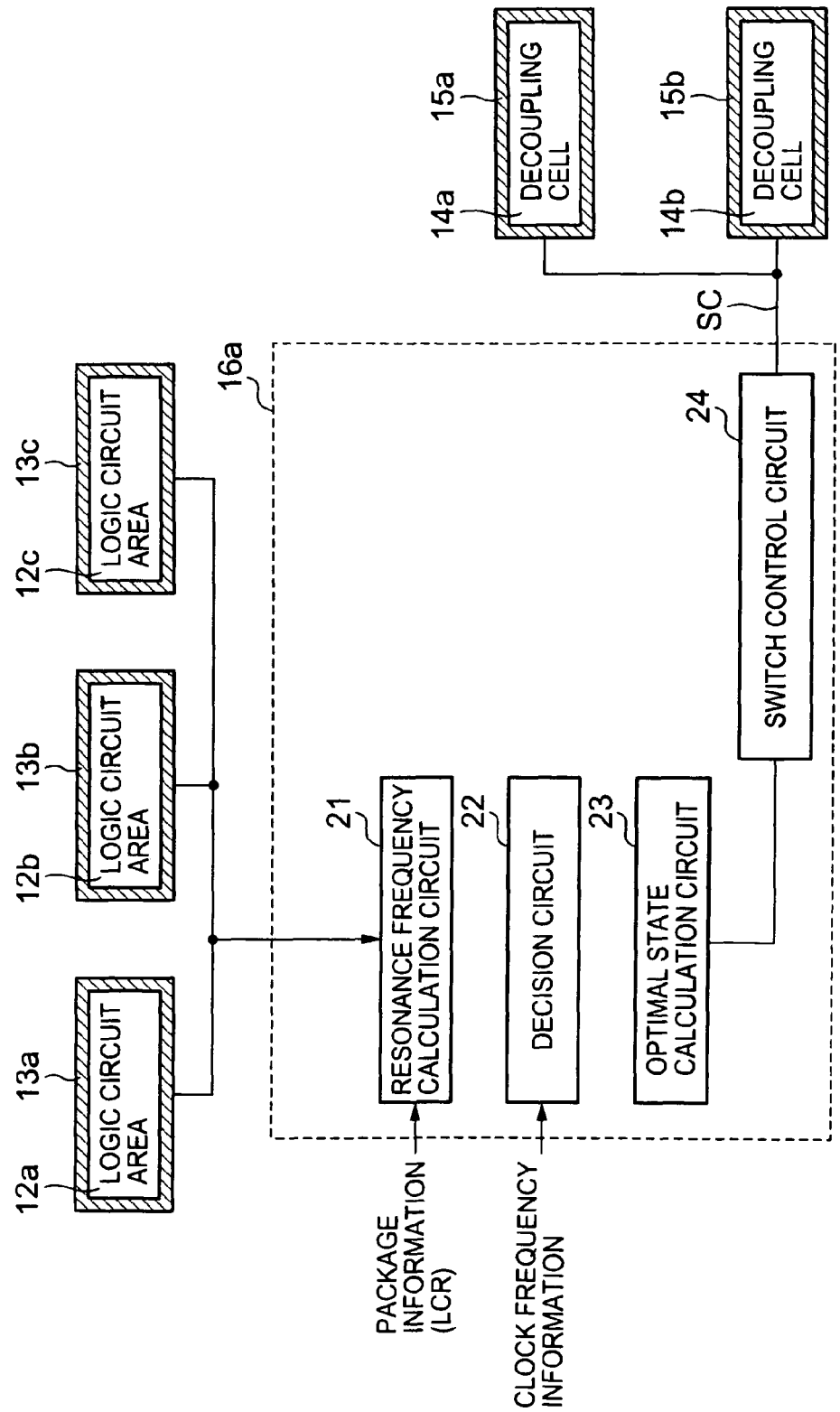
FIG. 9 is a block diagram of a control circuit in the second exemplary embodiment.

FIG. 8 shows a block diagram of a semiconductor integrated circuit device in a second exemplary embodiment. In this second exemplary embodiment, the same reference numerals will be used for the same components as those in the first exemplary embodiment, avoiding redundant description. As shown in FIG. 8, the semiconductor integrated circuit device 2 includes a control circuit 16*a*. The control circuit 16*a* inputs package information and clock signal frequency information from external. FIG. 9 shows a block diagram of the control circuit 16*a*.

As shown in FIG. 9, the control circuit 16*a* excludes the memory 20, the measurement circuit 25, and the comparison circuit/decision circuit 26 from the control circuit 16. In the control circuit 16*a*, the resonance frequency calculation circuit 21 inputs operation mode signals directly from the logic circuits 12*a* to 12*c*. The resonance frequency calculation circuit 21 also inputs package information directly from external and the decision circuit 22 inputs clock signal frequency information directly from external.

Figure 10:
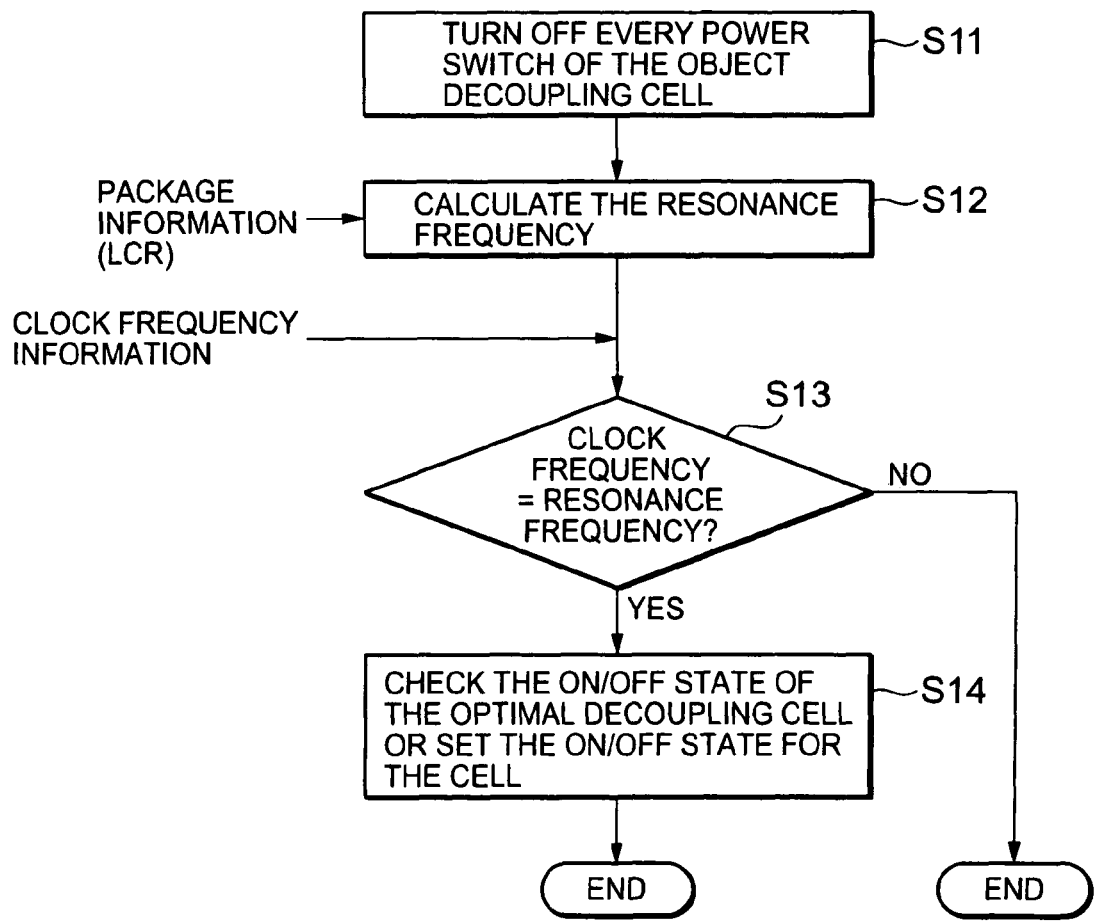
FIG. 10 is a flowchart of the operation of the semiconductor integrated circuit device in the second exemplary embodiment.

FIG. 10 shows a flowchart of the operation of the semiconductor integrated circuit device 2. As shown in FIG. 10, in the semiconductor integrated circuit device 2, only the steps S11 to S14 are carried out. Those steps S11 to S14 correspond to the steps S1 to S4 shown in FIG. 7. This means that the ON state of the power switch 15 is not corrected, although it is corrected according to the power noise level measured by the measurement circuit 25.

As described above, the semiconductor integrated circuit device 2 in this second exemplary embodiment can reduce the circuitry area by deleting some circuit blocks while it does not correct the ON state of each power switch according to the power noise level that is carried out in the semiconductor integrated circuit device 1. If there is a large surplus in the circuit operation with respect to the power noise level, even while the control circuit 16*a* controls the power switches 15, then the resonance frequency can be shifted from the clock signal frequency. This second exemplary embodiment can thus obtain the effect of power noise reduction satisfactorily.

Third Exemplary Embodiment

Figure 11:
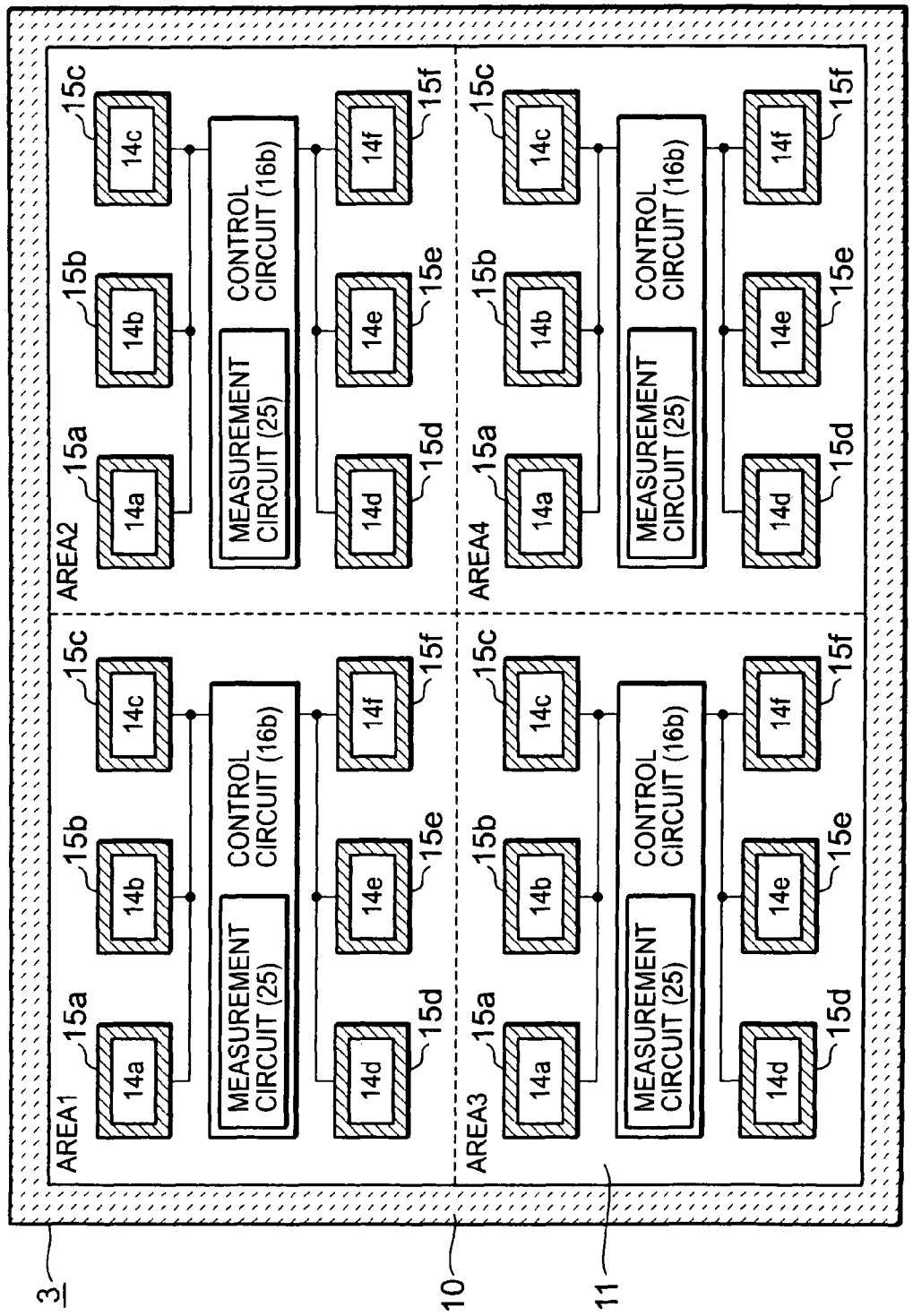
FIG. 11 is a block diagram of a semiconductor integrated circuit device in a third second exemplary embodiment.

FIG. 11 shows a block diagram of a semiconductor integrated circuit device 3 in a third exemplary embodiment. The semiconductor integrated circuit device 3 includes an internal circuit forming area divided into a plurality of areas (AREA1 to AREA4 shown in FIG. 11). Each of the areas includes a plurality of decoupling cells 14*a* to 14*f* and a control circuit 16. Although not shown in FIG. 11, it is premised that a plurality of logic circuit forming areas are formed in the semiconductor integrated circuit device 3. In this third exemplary embodiment, the same reference numerals will be used for the same components as those in the first embodiment, avoiding redundant description.

Figure 12:
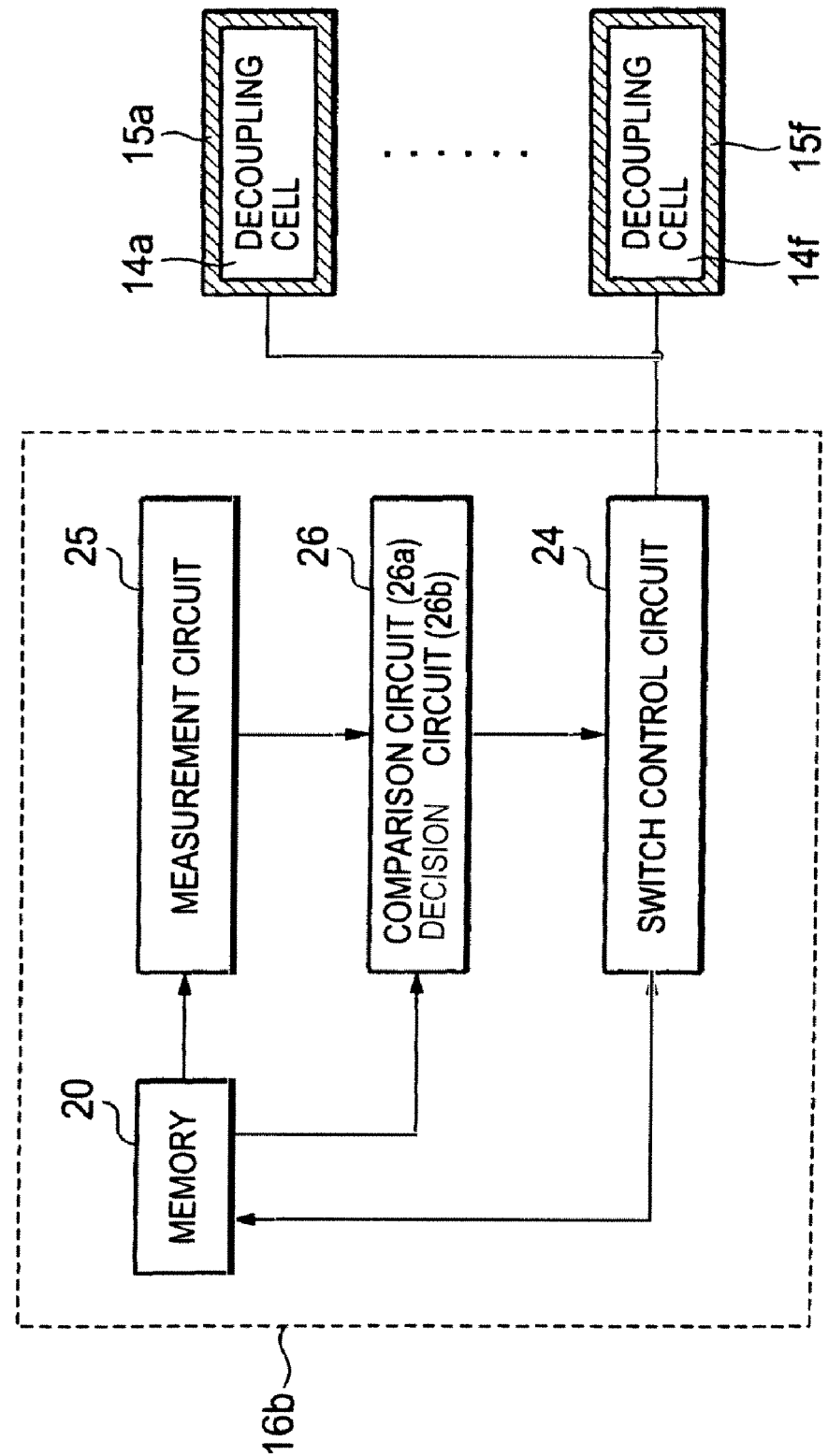
FIG. 12 is a block diagram of a control circuit in the third exemplary embodiment.

This third exemplary embodiment includes a control circuit 16*b*, which is a variation of the control circuit 16. FIG. 12 shows a block diagram of the control circuit 16*b*. As shown in FIG. 12, the control circuit 16*b* deletes the resonance frequency calculation circuit 21, the decision circuit 22, and the optimal state calculation circuit 23 from the control circuit 16. In the control circuit 16*b*, the memory 20 stores the reference value used by the decision circuit 26*b* and the ON state information of each of the power switches 15*a* to 15*f*.

In the semiconductor integrated circuit device 3, the power line resonance frequency changes according to the operation state of the object logic circuit just like in the first exemplary embodiment. In this third exemplary embodiment, the control circuit 16*b* controls the power switches 15 only when the power line resonance frequency changes according to the operation state of an object logic circuit and according to the relationship between the power line frequency and the clock signal frequency.

Figure 13:
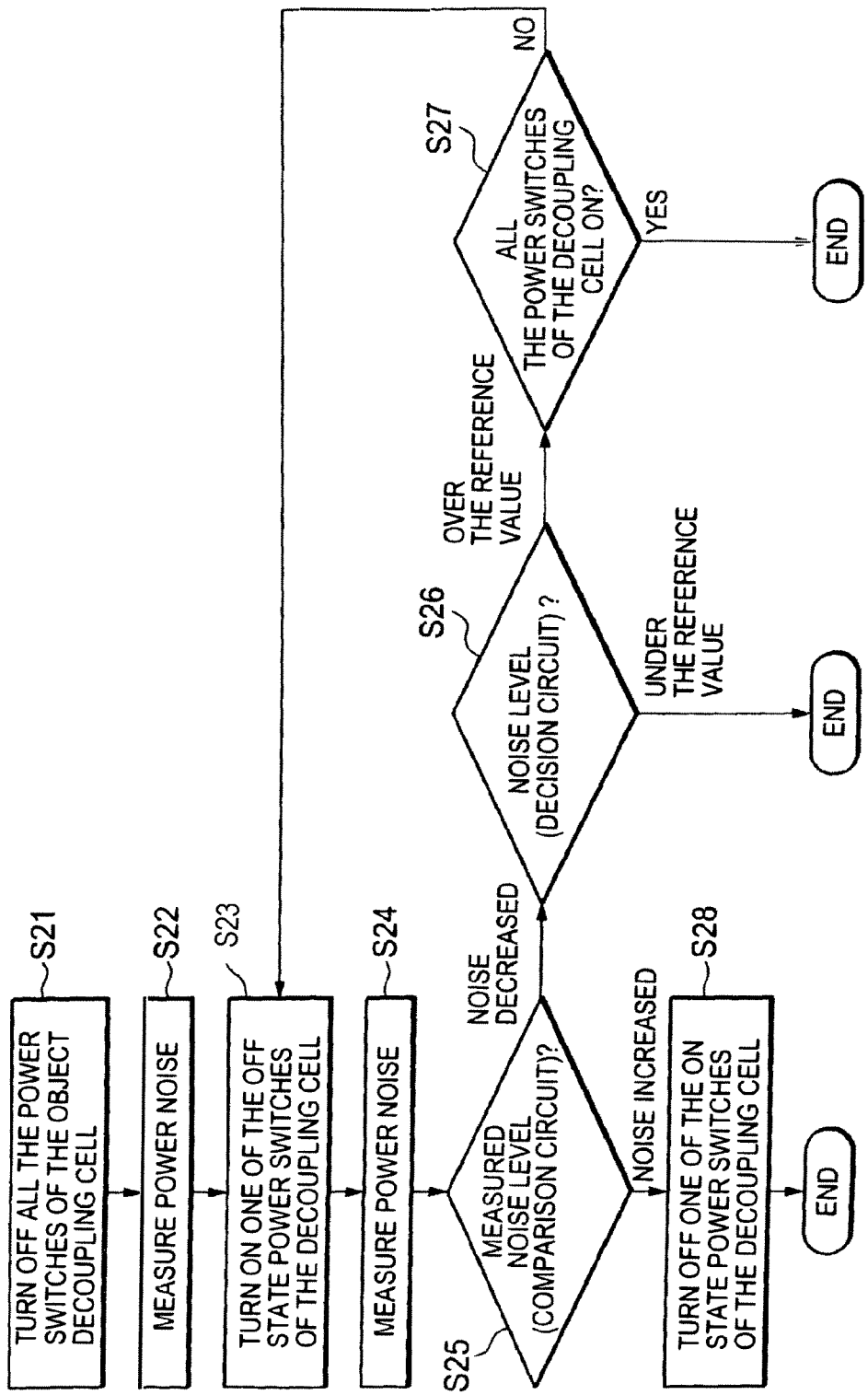
FIG. 13 is a flowchart of the operation of the semiconductor integrated circuit device in the third exemplary embodiment.
Figure 14:
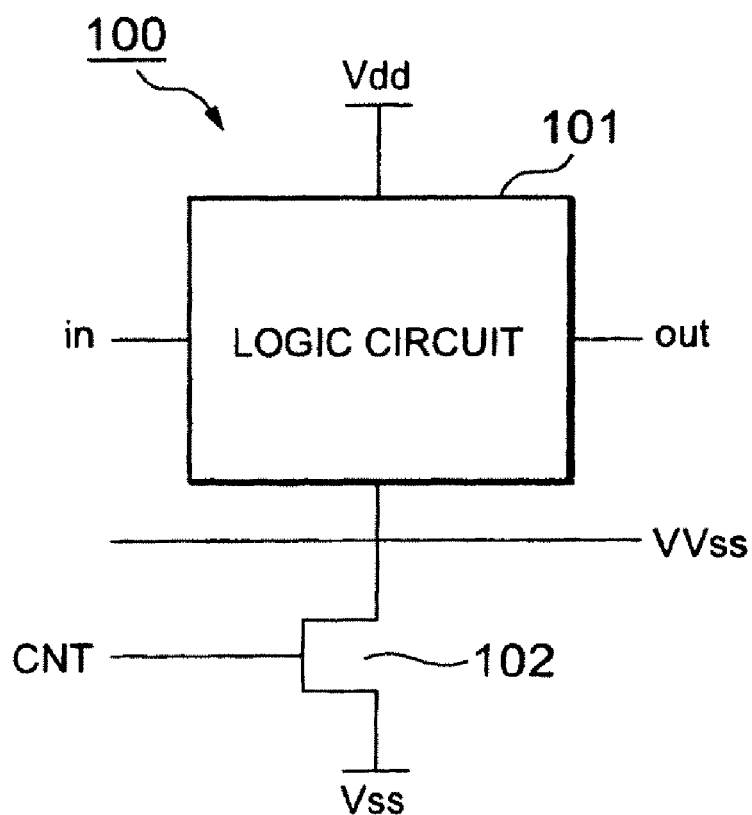
FIG. 14 is a block diagram of a semiconductor integrated circuit device in an related example 2.

FIG. 13 shows a flowchart of the operation of the semiconductor integrated circuit device 3. In this third exemplary embodiment, at first all the power switches of an object decoupling cell are turned OFF (step S21). Then, the measurement circuit 25 measures power noise (step S22). After that, the switch control circuit 24, receiving a notice of power noise measurement completion from the measurement circuit 25, turns ON one of the OFF state power switches (step S23). Then, the measurement circuit 25 measures the power noise again (step S24).

After that, the comparison circuit 26*a* compares the power noise level measured in step S22 with the power noise level measured in step S24 (step S25). If the result of the comparison in step S25 denotes that the power noise level after the switching-over in step S24 is lower, the decision circuit 26*b* then compares the power noise level measured in step S22 with the preset reference value (step S26). If the power noise level measured in step S24 is under the preset reference value, then the control circuit exits the power switch controlling. On the other hand, if the power noise level measured in step S24 is over the reference value, then the switch control circuit 24 decides whether or not all the power switches of the object decoupling cell are ON (step S27).

If it is decided in step S27 that all the power switches of the object decoupling cell 14 are ON, then the switch control circuit 24 exits the controlling of the power switches 15. On the other hand, if any of the power switches 15 is found to be OFF in step S27, then control returns to step S23. If the result of the check in step S25 denotes that the power noise level after the switching-over in step S23 is higher, then the switch control unit 24 turns OFF the power switch that was turned ON in step S23, and then exits the switch controlling (step S28).

As described above, in the semiconductor integrated circuit device 3 in this third exemplary embodiment, the number of power switches 15 is controlled so as to be turned ON according to the measured power noise level. And even in this third exemplary embodiment, according to the number of decoupling cells 14 to be activated, the power line resonance frequency is changed to reduce the power noise. And in this third exemplary embodiment, even when the clock signal frequency matches with the resonance frequency, no power switch is turned ON until the power noise level exceeds the reference value. Consequently, the leak current with respect to the power noise level in this third exemplary embodiment is reduced more than in other embodiments.

Furthermore, in this third exemplary embodiment, the internal circuit forming area is divided into plural areas, and decoupling cells 14 and a control circuit 16*b* are provided in each of those divided areas. Consequently, even when any logical circuit is active and the power noise increases locally, the power noise can be reduced effectively.

While the present invention have been described, it is to be understood that modifications will be apparent to those skilled in the art without departing from the spirit of the invention. For example, the measurement circuit can be modified as needed in accordance with how the semiconductor integrated circuit device is used.

Further, it is noted that Applicant's intent is to encompass equivalents of all claim elements, even if amended later during prosecution.

What is claimed is:

1. A semiconductor integrated circuit device, comprising:
a plurality of decoupling cells that suppress power noise respectively;
a plurality of power switches that connect the plurality of decoupling cells to a power line respectively; and
a control circuit that controls a number of power switches selected from among the plurality of power switches to be turned on according to a level of the power noise that changes according to an operation state of an internal circuit driven by a power supplied from the power line,
wherein the control circuit includes a resonance frequency calculation circuit that calculates a resonance frequency according to a parasitic component of a package and the operation state of the internal circuit, and
wherein the control circuit controls the number of power switches selected from among the plurality of power switches and to be turned on according to the resonance frequency and a frequency of a clock signal.

2. The semiconductor integrated circuit device according to claim 1, wherein the control circuit includes a memory that stores the frequency of the clock signal and a value of the parasitic component of the package.

3. A semiconductor integrated circuit device, comprising:
a plurality of decoupling cells that suppress power noise respectively;
a plurality of power switches that connect the plurality of decoupling cells to a power line respectively; and
a control circuit that controls a number of power switches selected from among the plurality of power switches to be turned on according to a level of the power noise that changes according to an operation state of an internal circuit driven by a power supplied from the power line,
wherein the control circuit includes a measurement circuit that measures the power noise, and
wherein the control circuit changes the number of power switches to be turned on according to the level of the power noise measured by the measurement circuit.

4. The semiconductor integrated circuit device according to claim 3, wherein the control circuit increases the number of power switches to be turned on if the level of the power noise measured by the measurement circuit is greater than a preset reference value.

5. The semiconductor integrated circuit device according to claim 3, wherein the control circuit decreases the number of power switches to be turned on if the level of the power noise measured by the measurement circuit increases after the number of on-state power switches increases.

6. A control circuit, comprising:
a resonance frequency calculator which calculates a resonance frequency;
a determination circuit which compares the resonance frequency with a clock frequency for driving a logic circuit for a comparison result; and
an optimal status calculation circuit, responsive to the comparison result of the determination circuit, which decides a difference value between the resonance frequency from the resonance frequency calculator and the clock frequency, wherein the difference value controls a number of decoupling cells being activated.

7. A control circuit, comprising:
a measurement circuit which measures a noise on a power source line;
a comparison circuit which compares the measured noise with a noise previously measured or a predetermined level; and
a controller which controls of decoupling cells being activated based on a comparison result.

8. The control circuit as claimed in claim 7, further comprising:
a resonance frequency calculator which calculates a resonance frequency; and a determination circuit which compares the resonance frequency with a clock frequency of a clock signal for driving a logic circuit; and
an optimal status calculation circuit, responsive to a result of the determination circuit, to decide a difference value between the resonance frequency and the clock frequency, wherein the result of the determination circuit controls the activated amount number of decoupling cells.

9. The control circuit as claimed in claim 8, further comprising: a memory which stores the clock frequency of the clock signal and a value of a parasitic component of a package sealing the logic circuit.

10. The control circuit as claimed in claim 8, wherein the measurement circuit, the comparison circuit, the controller, the resonance frequency calculator, the determination circuit, the logic circuit, and the optimal status calculation circuit are integrated as an integrated circuit,
wherein the resonance frequency calculator receives a value of a parasitic component of a package sealing the integrated circuit, inputted from an outside of the integrated circuit.

11. The control circuit as claimed in claim 10, wherein the determination circuit receives the clock frequency of the clock signal, inputted from an outside of the integrated circuit.

* * * * *